United States Patent

Herrlinger

[11] Patent Number: 5,825,247
[45] Date of Patent: Oct. 20, 1998

[54] ELECTRIC POWER AMPLIFIER AND METHOD FOR ITS OPERATION

[75] Inventor: Jochen Herrlinger, Erlangen, Germany

[73] Assignee: Mircea Naiu, Erlangen, Germany

[21] Appl. No.: 808,053

[22] Filed: Feb. 28, 1997

Related U.S. Application Data

[63] Continuation of Ser. No. 505,357, Jan. 24, 1996, abandoned.

[30] Foreign Application Priority Data

| Mar. 2, 1993 | [DE] | Germany | 43 06 436.1 |
| Mar. 16, 1993 | [DE] | Germany | 43 08 287.4 |

[51] Int. Cl.$^6$ ..................................................... H03F 3/30
[52] U.S. Cl. .......................... 330/265; 330/267; 330/270
[58] Field of Search .................................. 330/255, 265, 330/267, 268, 270, 273, 274

[56] References Cited

U.S. PATENT DOCUMENTS

| 4,316,149 | 2/1982 | Yamaguchi | 330/268 |
| 4,439,743 | 3/1984 | Schwarz et al. | 330/267 |
| 4,476,441 | 10/1984 | Gulczynski | 330/267 X |
| 4,558,288 | 12/1985 | Nakayama | 330/268 |
| 4,888,559 | 12/1989 | Sevenhans et al. | 330/255 X |
| 5,055,797 | 10/1991 | Chater | 330/268 |
| 5,148,116 | 9/1992 | Robinson | 303/268 |

Primary Examiner—James B. Mullins
Attorney, Agent, or Firm—Frank H. Foster; Kremblas, Foster, Millard & Pollick

[57] ABSTRACT

An improved power amplifier having complimentary power transistors connected in push-pull arrangement, and having a bias voltage source coupled to the transistors for generating a transverse idling current flowing through the complimentary pair of transistors. A regulating, feedback control circuit has a set point input and inputs connected to precision resistors connected to detect the current through the power transistors and the output current. Analog arithmetic computing circuits continuously compute the instantaneous difference between the detected transverse idling current through the power transistors and the set point input for the idling current. The output of the controller circuit is connected to the bias voltage sources to vary the bias voltage in proportion to the instantaneous difference between the detected transverse idling current and the set value of idling current to maintain a constant, transverse idling current.

21 Claims, 7 Drawing Sheets

ELECTRIC POWER AMPLIFIER AND METHOD FOR ITS OPERATION

This is a continuation of application Ser. No. 08/505,357, filed Jan. 24, 1996, now abandoned.

FIELD OF THE INVENTION

The invention relates to an operating method and a circuit layout of an electric power amplifier which comprises a plurality of power amplifier elements (for example tubes or power transistors), which are assigned to one another complementarily in pairs in a push-pull B operating circuit, wherein one or more bias voltage circuits are coupled to the input circuit of the amplifier element pair so that the most constant idling current as possible flows through the amplifier element pair.

DESCRIPTION OF THE PRIOR ART

In power amplifier engineering such amplifier systems are known as class B amplifiers (cf. for example Neufang, is "Lexikon der Elektronik", Brunswick, 1983, Vieweg-Verlag). For example, two amplifier elements (tube, transistor) are connected so that with a sinusoidal input signal voltage an active component takes over the positive component of the alternating voltage and the second one takes over the negative component. Each active component conducts the load current during a half period. The operating point lies for each of the amplifier elements at the end of the straight-line section of the input characteristic, shortly before the start of the curve. Because of the particular nature of the symmetrically constructed circuit, the envelopes of the output characteristic curves of the two active elements are composed graphically in such a way that an enlarged alternating current operating straight line is obtained. In the ideal case of this push-pull amplifier operation the positive and negative components of the signal input quantity lie undistorted at the signal output as a complete sine signal on the load resistance. There is known as an actual circuit realization the arrangement of two power transistors as mutually complementary emitter followers in push-pull B operation (cf. Tietze-Schenk, "Halbleiter-Schaltungstechnik", Springer-Verlag, 9th edition, pages 513 ff.), in which the two power transistors are each live alternately for a half period of the input signal oscillation. The forward voltage of 0.7 volt between base and emitter terminals, occurring for example in the case of silicon transistors, has a disadvantageous effect here, since only from the latter onwards does a significant collector current flow, resulting in the transient distortions known per se.

Class AB amplifiers are known as a remedy, in particular the arrangement of two complementary power transistors, each as emitter followers, in AB operation (cf. "Lexikon der Elektronik", op cit.; "Halbleiter-Schaltungstechnik" op cit., pages 516 ff.); if a small idling current is allowed to flow through both the active amplifier elements, in particular power transistors, by the application of a bias voltage to the signal input electrodes, their resistance in the vicinity of the zero point drops, wherein the transient distortions already diminish considerably. With small signal activations there arise automatically at the input operating conditions of a class A amplifier known per se (cf. literature sources quoted), with large signal activation the conditions of a class B amplifier, The operating point migrates on the characteristic between A operating mode, where the operating point lies in the middle of the activation range of the operating characteristic, and B operating mode, where the operating point lies at the bottom end of the operating characteristic. In order to achieve these operating conditions, it is possible for example in the case of silicon transistors to apply a bias voltage of 0.7 volt, so that the transistors are also opened in the idling state and small activation signals are reproduced undistorted at the output. Problems arise, however, in keeping the idling current generated with the bias voltage constant. In this context the measure is known of producing a current feedback by the insertion of serially arranged resistors between the power amplifier elements, in particular transistor emitter followers. However, since the resistors lie in series with the connected load, the output power level obtainable is reduced. It is also known, in order to generate the idling current flowing through the emitter-collector zone of the power transistors, to supply a base current for the transistors by means of constant current sources. In order that the base current supplied can increase with rising activation, the use of field-effect transistors in the form of source followers is known (cf. Tietze-Schenk "Halbleiter-Schaltungstechnik", page 519), in which their source voltage difference comes to approx. 1.4 volt as a result of current feedback.

SUMMARY OF THE INVENTION

The problem underlying the invention arises, namely of devising further, more efficient methods of keeping the idling current for AB operation constant, wherein the control of the idling current is decoupled from the oscillation of the amplifier output signal. As great a bandwidth as possible is to be achieved at the same time. It is proposed as a solution, in the case of a power amplifier operating method of the kind mentioned in the preamble, in which the idling current is kept as constant as possible at a set value by means of a current feedback, that the operating points of the power amplifier elements are so displaced, according to the deviation of the closed-loop idling current from the set value and/or as a function of the signal frequency, that the set value deviation is minimized. The operating points of the two complementary amplifier elements are therefore moved as a function of the frequency in such a way that the idling current always remains constant and its setting does not obey the oscillation of the (amplified) output signal. As an implementation of this basic inventive idea it is proposed that the adjustment of the operating points is brought about by control of the bias voltage sources, for example adjustment of their control input voltages, in such a way that their output-side d.c. voltage level is increased or diminished. A genuine, flexible control of the idling current is therefore achieved with the method according to the invention.

DESCRIPTION OF THE PREFERRED EMBODIMENTS

Figure 1:
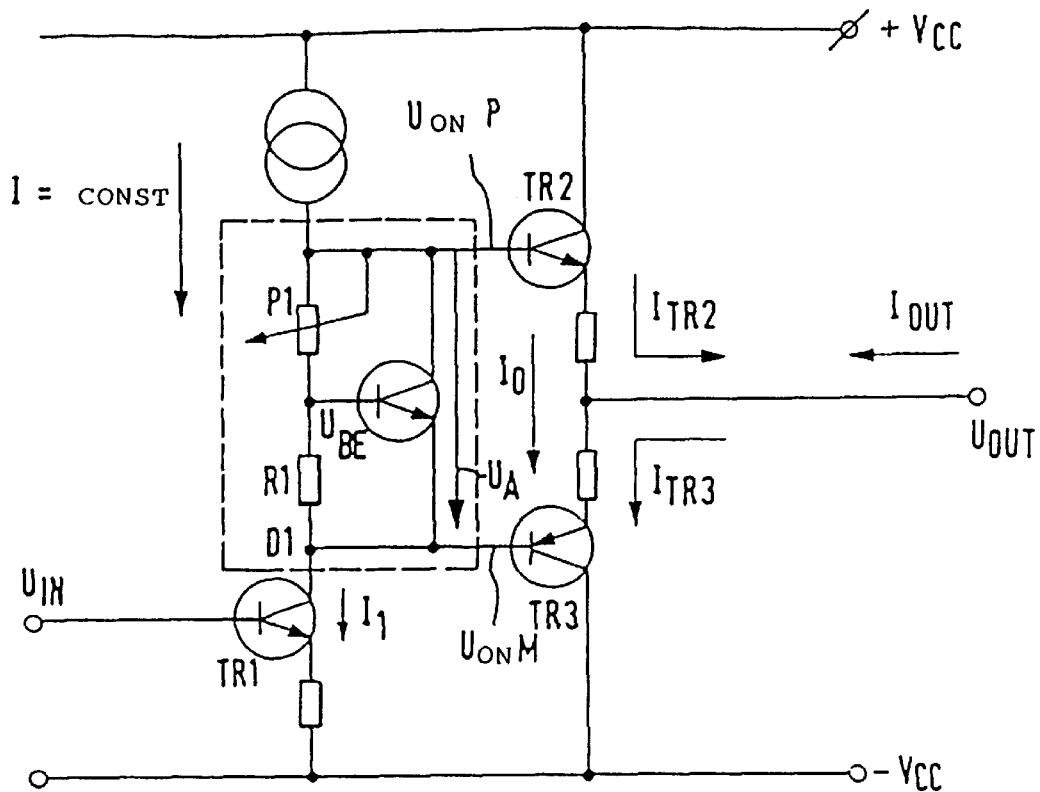
FIGS. 1 and 2 are two power amplifier circuits, as known per se from the prior art.

With a power amplifier circuit of the kind mentioned in the preamble a circuit layout is proposed within the scope of the invention such that a control member is so connected to the complementary power amplifier elements that the actual value of the (momentary) idling current is fed to it, compared with a set value, and it thereupon selects the bias voltage source(s) for keeping the idling current constant. If the controller senses for example an increase in the idling current, it reduces the voltage existing at the signal input electrodes of the power amplifier elements, which results in a modification of the "static" operating points of the latter.

There is suitable with expediency, as a suitable realization of the positioning device "bias voltage source" for the quantity "idling current of the amplifier elements" to be adjusted, a preferably multistage small-signal amplifier activated by the controller, which can also be integrated structurally with the controller. As a particular implementation of this idea, two small-signal amplifier branches each activated by the controller are provided, which are each assigned to one of the power amplifier elements complementary in pairs.

With advantage the controller is coupled between the power amplifier elements complementary in pairs and possesses its own power signal output, by means of which the (summed) output currents of the amplifier elements are looped out. The advantage consists in the fact that one or more further power amplifier elements can be connected in parallel at this power signal output of the controller, wherein each power amplifier element can be controlled by the controller. The possibility is thereby created of modifying the power capacity at the output of the amplifier system according to the invention as per requirement and application by the parallel connection of such expansion stages or modules, in each case in a push-pull B operating circuit, modularly and flexibly. For the controlling of the expansion stage by the controller a coupling member arranged between the latter is suitable, which is realized with advantage as an impedance transformer and/or an active control element controlled by the controller. These control elements or impedance transformers can each be assigned to one of the power amplifier elements complementary in pairs of positive or negative polarity and be connected in parallel to control leads brought out of the controller, so that they form a preferably adapted analog bus, With advantage the output signals of the controller are of a complementary-symmetrical shape such that they are assigned half and half to the power amplifier elements of positive and negative polarity or operating voltage. A clearly laid out circuit layout is achieved in this way.

For the realization in switching terms of the recording of the set value deviation for the controller, a development of the invention is proposed according to which there are incorporated structurally in the controller a reference voltage source or a reference current source together with a switching element, in particular constructed as a comparison element, wherein the latter is connected to the reference source and to the idling current of the power amplifier elements for the determination of the set value deviation.

The application of sophisticated control concepts and strategies can be assisted by the use of an analog computer as a controller. Idling current control signals can be generated with the latter—as a further development of the invention—if the analog computer comprises arithmetical comparison or summing circuits for the idling current of the power amplifier elements and the reference current, and a multiplying circuit is connected in parallel with the summing circuit, which performs a multiplication with a constant. The idling current control signal can with advantage be mixed with the amplifier useful signal at another point within the amplifier system, for example in the course of the bias voltage generation by means of small-signal amplification.

The use of an analog computer as the centre-piece of the amplifier circuit is also useful in generating feedback signals according to specified arithmetical rules. Thus, the feedback signals can be generated according to particular mathematical functions, for example of the amplifier or controller output voltage, of the current flowing through an active amplifier element, of the above-mentioned idling current control signal etc.. The feedback signals are then with particular advantage fed to the above-mentioned small-signal amplifier stage, which in such cases is constructed with expediency as a differential amplifier.

The analog computer can be used in a similar way, by the connection of arithmetical circuits for addition, multiplication etc., to generate output signals which can be combined to form the above-mentioned analog bus for the above-mentioned power elements. There is furthermore obtained with the use according to the invention of the analog computer the prospect of generating for the bias voltage generation or the corresponding small-signal amplifier a feedback signal consisting of the output voltage and a fault voltage for the idling current. A suitable development also consists in allowing the analog computer to calculate the power loss of the active power amplifier elements and in the event of an exceeding of maximum limit values to protect the final power stage against overloading.

The regulation of the idling current according to the invention has the advantage that a frequency-dependent increase in this idling current is effectively counteracted and hence the bandwidth of the power amplifier is significantly enhanced. Although such a regulation is on the one hand extremely effective, on the other hand the practical layout is very expensive, due to the different voltage potentials of the input and output signals, which sometimes fluctuate within wide margins, and due to the determination and processing of current signals, and it can lead to a dramatic rise in cost of the power amplifier.

In order to create the simplest possible realization of the power amplifier in technical terms, the invention provides, in the case of an electric power amplifier with two power amplifier elements, power transistors arranged in particular as emitter followers or in an emitter circuit, which are assigned complementarily to one another in a push-pull B operating circuit, with one or more bias voltage sources which are coupled to the input circuit of the amplifier element pair for generating a constant idling current flowing through the power amplifier elements, and with a controller connected to the power amplifier elements for recording their output values, which activates the bias voltage sources for keeping the idling current constant, transducers for recording the currents flowing through the power amplifier elements and the output current of the power amplifier. Such transducers do not distort the measured values concerned. In addition such a recording of measured values is highly accurate. This is an advantage compared with other forms of execution, where in particular the currents flowing through the power amplifier elements are replaced by other operating parameters of the power amplifier elements, such as collector-emitter voltage or base current. The recording of other operating parameters is not suited, because of the dependence of these parameters on operating point, temperature and frequency, to supplying accurate measured values for the currents flowing through the power amplifier elements. The effectiveness of the idling current control depends to a large extent on the fact that the actual value of the idling current is recorded accurately or at least determined accurately from other recorded values. An estimate based on other, more easily accessible operating parameters is not sufficient for this purpose.

An advantageous development of this principle lies in the fact that the signal outputs of the transducers are star-connected. It is therefore possible to relate the output signals of all the transducers to a common potential, namely that of the star point. This facilitates further processing of the measured signals as part of the idling current control.

It has proved beneficial that the transducers are ohmic resistors connected into the respective circuit. Such transducers represent the simplest and at the same time equal-value transducers, which convert the currents concerned into voltage signals proportional thereto, which can be processed in turn by the idling current controller.

In this embodiment a beneficial development consists in the fact that the free terminals of the transducers are connected to the outputs of the power amplifier elements on the one hand and to the output of the power amplifier on the other. If precision resistors are used as transducers, care must be taken that signal inputs and outputs are identical. For this reason all the terminals of the precision resistors must be connected to a common star point, in order to obtain a common reference potential for the signal outputs. A star connection is possible, however, only on the output node of the power amplifier.

Consequently the free terminals of two precision resistors are connected to the outputs of the power amplifier elements, while the free terminal of the third precision resistor forms the output of the power amplifier. There therefore lie between the two power amplifier elements two precision resistors in series, at whose connection node a third precision resistor is connected, through which the output current flows. The output voltage of the power amplifier is modified only slightly by these precision resistors. However, if these only minor modifications are not small enough, the output signal at the free end of the precision resistor concerned can be fed back and adjusted to the ideal shape with great precision by means of a voltage regulator.

It comes within the scope of the invention that the reference potential of the idling current controller is equal to the potential of the star point of the transducer. Such an arrangement has the advantage that test signals are available for processing by the analog circuit of the idling current controller which are calibrated to the zero potential of the latter and proportional to the current signal concerned. Further level displacement without correction for distortion is not required.

If the potential of the idling current controller is coupled to the potential of the star point of the transducer, it has to execute virtually the whole voltage swing of the output signal. Because of this fluctuating reference potential it becomes necessary to provide additional supply voltages for the idling current controller, which are kept constant compared with the potential of the star point of the transducer that serves as reference potential.

For the processing of the actual current values determined in this way the invention provides an analog circuit within the idling current controller, which forms from the test signals for the currents flowing through the power amplifier elements and for the output current of the power amplifier a test signal proportional to the idling current. This part of the analog circuit forms a central part of the idling current controller and can be realized according to various algorithms. One possibility consists in subtracting from one another the test signals for the currents passing through the two amplifier elements, which because of the symmetry with the star point exhibit opposite polarity, subtract therefrom the value of the test signals for the output current and divide the result by two. Such addition, subtraction and multiplication circuits have been known for a long time and can be constructed with the aid of operational amplifiers without any difficulty.

According to the present invention the idling current controller also incorporates a subtraction circuit for obtaining the difference between the arithmetical signal proportional to the idling current and a set value for the constant idling current. Such a subtraction is an elementary constituent of any proportional controller and permits a comparison of set value and actual value of the idling current, wherein the controller output is adjusted in proportion to this difference.

In order to adapt the controller output signal to the maximum possible range of the controller output affected, and to optimize the controller characteristics, the invention provides that in order to obtain the controller output signal the arithmetical signal proportional to the difference between idling current set value and actual value be multiplied by a factor, in particular be amplified. The multiplication factor influences the quality of the control and the permanent standard deviation and in addition has an influence on the stability of the circuit. For this reason it makes sense to determine the multiplication or amplification factors experimentally, It has proved beneficial that the output signal of the idling current controller, in order to form the activation signal for one of the power amplifier elements, is superimposed additively or subtractively on the optionally pre-amplified amplifier input or voltage regulator output signal. Since the amplifiers are in general represented by power transistors with three terminals—collector, base, emitter—, in general only the input signal at a control input, usually the base, is available as controller output. For in most cases one of the two power terminals is connected to one of the two supply voltages, while the other power terminal forms the output. In order to obtain an idling current circuit with the most linear and hence comprehensible and predictable characteristics as possible, the output signal of the idling current controller is superimposed linearly on the amplifier input signal to be amplified or on the output signal of a superior voltage controller. Since only the activation signal of one of the two power amplifier elements is influenced in this way, a superior voltage controller can nevertheless stabilize accurately the output voltage of the power amplifier.

It is also possible, without affecting the control characteristics of a superior voltage regulator, in order to improve the idling current control, to superimpose the output signal of the idling current controller for forming the activation signal for the other power amplifier element on the optionally pre-amplified input signal or the controller output signal of a superior voltage control circuit with reverse polarity. If therefore in the ideal case the activation signals for the two power amplifier elements are set in reverse direction by exactly the same amount, the output voltage of the power amplifier is not influenced at all by this, so that the superior voltage regulation is virtually independent of the idling current control.

Since therefore in the case of both of the embodiments described above different activation signals have to be generated for the two power amplifier elements, it becomes necessary to provide separate activation stages for the two power amplifier elements. Whereas in one of the two activation stages the input signal is superimposed linearly on the output signal of the idling current controller, in the other activation stage either no superimposing or a superimposing with reverse polarity of the idling current controller output signal takes place.

For the realization of the linear superimposing of amplifier input or voltage regulator output signal on the idling current controller output signal, the invention provides that the output transistor of transistors of the activation stages(s) coupled with the output signal of the idling current controller are operated in an emitter circuit and the superimposing of amplifier input or voltage regulator output signal on the idling current controller output signal takes place by current feedback by means of an emitter resistor connected into the emitter circuit of the transistor, which emitter resistor conducts in addition to the emitter current of the activation transistor a control current proportional to the output signal of the idling current controller. Because of the high potential differences between the input signal of the power amplifier or of the output signal of a superimposed voltage regulator compared with the activation potential for the power amplifier elements on the one hand and the potential of the idling current controller compared with the activation signals of the power amplifier elements on the other, it makes sense to convert the amplifier input and/or controller output signals into potential-independent current signals proportional thereto. Such a current signal can be converted back by means of a resistor connected to suitable potential into a voltage swing which then influences the output signal of the activation stage. If this voltage signal is used to activate the base of an output transistor of the activation stage which is operated in an emitter circuit, it is possible to connect a feedback resistor into the emitter circuit of this transistor. Assuming suitable dimensioning of the activation stage the voltage at this feedback resistor is approximately identical to the voltage at the input resistor of the activation stage, so that the current passing through this emitter resistor is proportional to the input current signal of the activation stage. The term current level (Stromspiegel) is also used in such a case. The output signal of this activation stage, namely the potential at the collector of the output transistor, can furthermore be influenced by the fact that the emitter resistor concerned can flow through an additional current proportional to the output signal of the idling current controller and the current feedback thereby be increased or diminished according to polarity. A current addition or subtraction therefore takes place on approximation in the emitter resistor, which influences the output signal of the activation stage accordingly and hence makes an adjustment of the operating point of the power amplifier elements possible.

For the coupling of the output signal of the idling current controller into the emitter resistor of the activation stage the invention provides that the arithmetical signal proportional to the difference between idling current set value and actual value be amplified in a differential amplifier one of whose collector resistors is identical to the emitter resistor of the activation stage serving for the current feedback. Such a differential amplifier thereby fulfils several functions: the arithmetical signal proportional to the difference between idling current set value end actual value is amplified in order to obtain optimal controller characteristics. In addition the controller output signal is superimposed on the impressed direct current of the differential amplifier and hence converted into a proportional current signal which makes a potential displacement possible. Finally this current signal is at the collector resistance identical to the feedback resistor of the activation stage converted back again into a voltage signal which influences the output signal of the activation stage.

Finally, it accords with the teaching of the invention that each activation stage is formed from two complementary transistors arranged in an emitter circuit and operated in push-pull, and each having an emitter resistor, wherein these emitter resistors are identical to the collector resistors of each branch of differential amplifiers arranged symmetrically to the reference potential of the idling current controller In order to enhance the effectiveness of the circuit, i.e. to improve the control characteristics and also to reduce the power consumption, the invention provides that each activation stage comprises two complementary transistors operating in a push-pull B operating circuit, whose output terminal—optionally by interconnection of a driver—activates the control input of a power amplifier element, Each activation stage therefore comprises two mutually complementary output transistors into each of whose emitter circuits a feedback resistor is connected. Because of the symmetrical layout of such an activation stage it is possible to couple into both feedback resistors a current signal proportional to the idling current controller output signal. Because a current of inverse polarity relative to the reference potential of the idling current controller flows through these two feedback resistors, however, there have to be provided for the latter, at the output of the idling current controller, two differential amplifiers with a layout symmetrical to the reference potential of the idling current controller. Since the output signals of a differential amplifier vary in opposite directions, a feedback of the second activation stage by means of the other output is possible, so that each of the four emitter resistors of the two activation stages is coupled to the four outputs of the two differential amplifiers.

Figure 2:
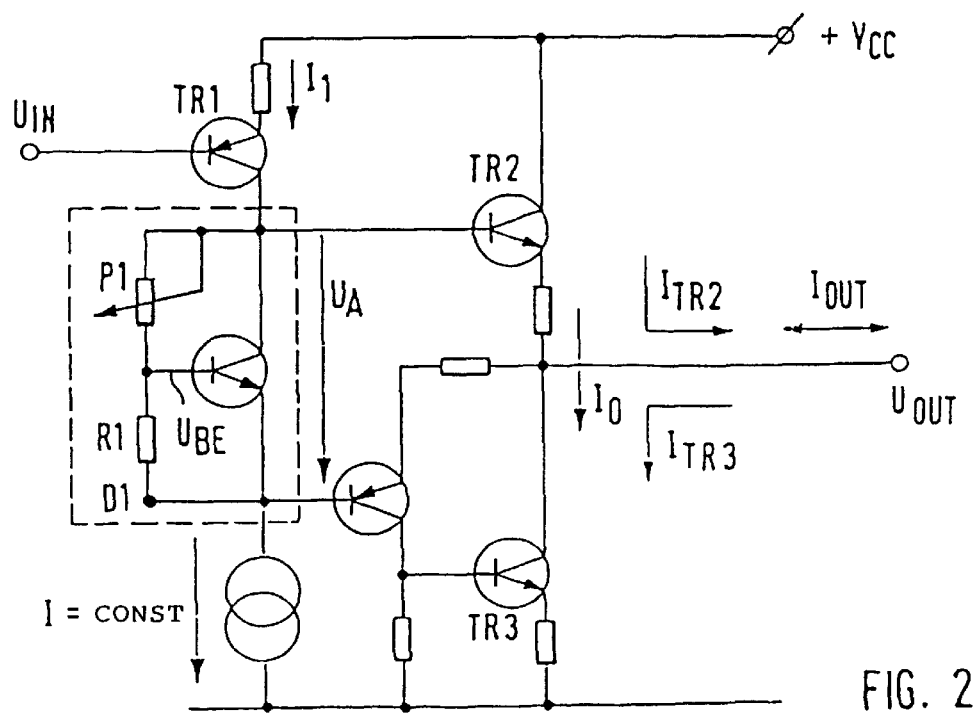

It is known to use in the output stages of amplifiers various versions of a combination of two unity-gain amplifiers. Two such standard basic stages are shown in FIGS. 1 and 2. For high output and/or high output current these stages known per se nevertheless have their limitations:

In order to reduce transient distortions, the so-called superdiode network D1 is adjusted so that an idling current 10 flows through the transistors TR2 and TR3 provided as mutually complementary emitter followers. The idling current 10 comes for power amplifiers conventionally to 50–160 milliamperes. This idling current leads however to an undesirable loss of power in the transistors TR2 and TR3. The superdiode network D1 simulates the direct voltage drop of a diode, multiplied by an optional number >1:

$$U_a = (1 + P1/r1) \times U_{BE}$$

The aim is to open the transistors TR2 and TR3 (FIG. 1) easily. This means that the voltage $U_A$ must be slightly greater than $2 \times U_{BE}$. $U_A$ is actually the measured voltage between the two base electrodes of the complementary power transistors TR2 and TR3.

The transient distortions depend on the value of the idling current 10 and the frequency of the signal to be amplified. The distortions also become greater at higher frequency.

Consequently the complementary transistors TR2 and TR3 cannot be brought into the turned-on state again directly after turn-off and vice-versa. This results in the distortions being greater at higher frequencies. If the frequency has reached too high a value, the idling current increases, wherein the transistors TR2 and TR3 can be destroyed; for the timing of the turn-on time "$t_{ON}$" and the turn-off time "$t_{OFF}$" is different for particular semi-conductors. All measures to provide protection against excessive current cannot prevent the transistors TR2 and TR3 being destroyed at a particular frequency level.

The frequency bandwidth of such known amplifier circuits is conventionally limited not only on account of the above-mention problem areas, but also because of the fact that the input control stage TR1 should obey the full oscillation of the output voltage. In addition only a limited, constant current I1 is provided for charging the stray capacitance.

For good results, the power output transistors must be paired in the case of the amplifier circuit known per se, particularly if a parallel connection of the power transistors is required for greater outputs.

Figure 3:
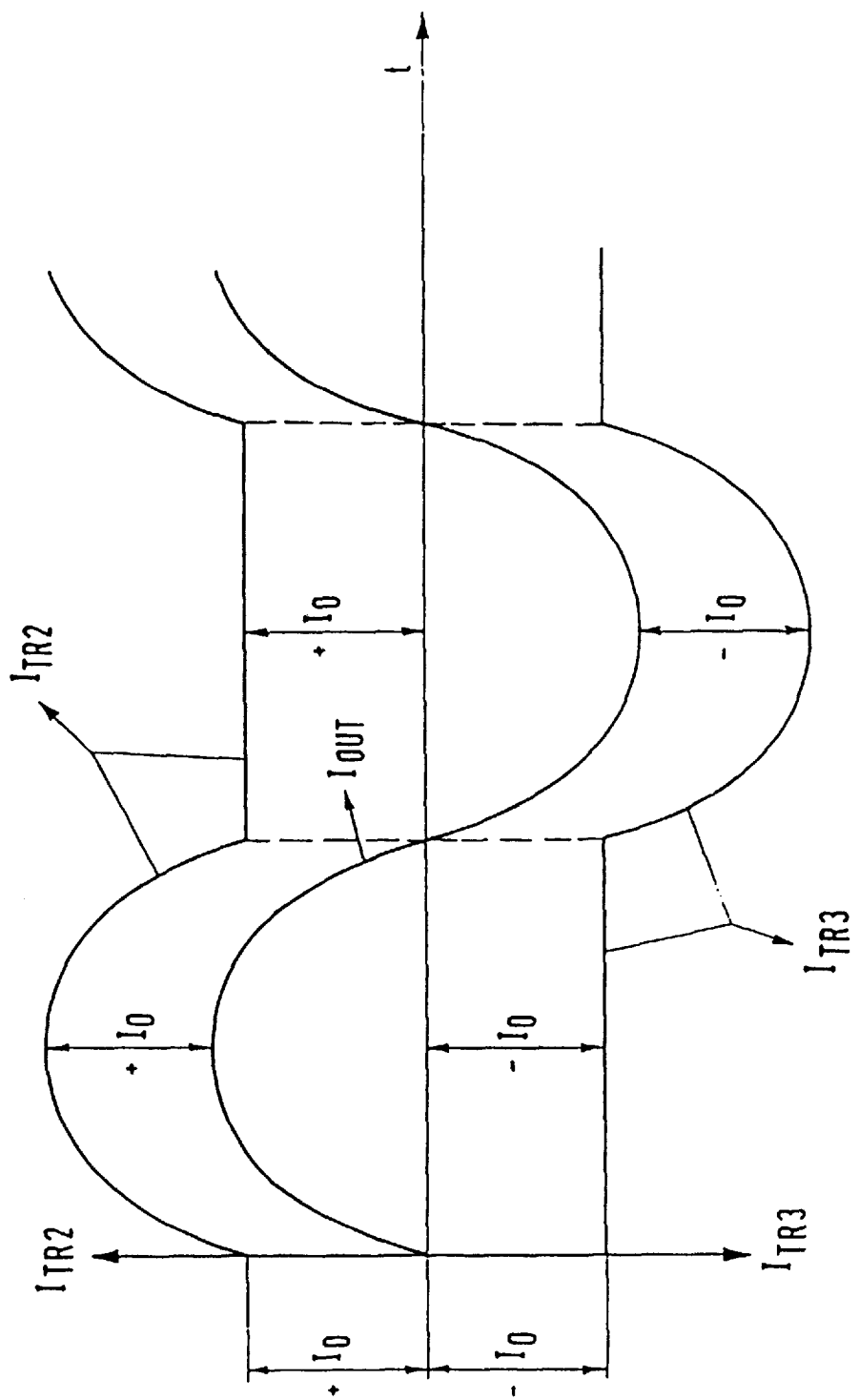
FIG. 3 is a current-time diagram.

The inventive idea for overcoming the problems just mentioned consists in the control of the idling current by a feedback which actually converts the class B output stage into a genuine class A output stage, although the hardware configuration remains at bottom a class B output stage. The feedback acts in such a way that the transistors TR2 and TR3 are never turned off. FIG. 3 shows the fundamental current flow in the achieved output stage for a sinusoidal output signal. This solution can be applied in all kinds of amplifiers, whether integrated or not. The advantages of this stage are as follows:

The transient distortion is reduced dramatically, and in some cases disappears completely, because the stage operated according to the method shown in FIG. 3 functions according to the A operating mode or like a class A amplifier. The idling current can be far smaller than in stages known to date. It is possible theoretically for the idling current I0 to assume the zero value. Consequently the idling power loss is dramatically reduced.

The bandwidth is much greater with operation according to the invention, because the "static" operating point of the transistors TR2 and TR3 moves as a function of the frequency in such a way that I0 always remains constant and the control does not obey the oscillation of the output voltage.

With the circuit according to FIG. 1 or 2 the collector voltage of the input transistor TR1 is a function of the input voltage $U_{IN}$. If the amplification of the driver stage TR1 is $A_U$, then for the collector voltage $$U_{TR1} = -A_U \times U_{IN}.$$

In practical terms the collector voltage, because of the saturation voltage of the transistor TR1 and the saturation voltage of the current source, can have only values just below the supply voltages.

Stray capacitances arise in any circuit. Normally these stray capacitances are sufficiently small not to exert a major influence in the low frequency range. The situation is different in the high frequency range. The voltage on the (notional) capacitor terminals is directly proportional to the electric charge Q and inversely proportional to the capacity of the capacitor. It can now be stated that the voltage at the terminals of the notional capacitor can fluctuate only at the speed at which the electric charge in the capacitor can be modified. The charge is however dependent on the product of current and time. In our example the current I1 flowing through the input transistor TR1 is constant. The rapidity of the voltage fluctuations on the collector of the input transistor or of the driver stage TR1 can be increased (inter alia) by enlargement of the current I1 flowing through and/or reduction of the stray capacitances. The stray capacitances for a circuit are given, and the current I1 of the input transistor TR1 can scarcely be increased, unless the input transistor TR1 is to be a power transistor, as a result of which its own maximum operating frequency becomes lower.

In order to achieve the maximum voltage fluctuations (right up to the supply voltages $\pm V_{CC}$) at the output of the amplifier circuit, the input driver stage TR1 must fluctuate the same number of times, because the complementary power transistors possess as a voltage follower or emitter follower the voltage amplification A=1.

Another possibility would be for the driver stage not to operate with the whole output voltage fluctuation. Such a solution can likewise be illustrated in FIG. 1.

How the control voltages $U_{ON}P$ and $U_{ON}M$ are obtained is immaterial. What matters is that their fluctuations are very small. In this way the bandwidth is at least not limited by the concept of the driver stage. Moreover the concept facilitates the control by an analog computer (see below).

The movement of the "static" operating points of the power transistors TR2 and TR3 as a function of the frequency is based on the concept according to the invention:

In the idling state the control voltages $U_{ON}P$ and $U_{ON}M$ have a d.c. voltage level which easily opens the power transistors TR2 and TR3, so that an idling current I0 can flow. If the amplifier is controlled, the control voltages $U_{ON}P$ and $U_{ON}M$ consist of a mixture of the useful signal and the d.c. voltage level. In amplifiers known to date this d.c. voltage level is constant, which results in the power transistors TR2 and TR3 both being opened simultaneously only in the idling state or briefly during the passage through zero. This leads to transient distortions. According to the invention, on the other hand, the d.c. voltage level is not kept constant, but is controlled by the analog computer explained further below. With a rise in frequency, the electric charge accumulated in the base-emitter transition layer causes a further opening of the transistors TR2 and TR3. This tends to result in an increase in the idling current I0. The analog computer senses the increase in the idling current, however, and reduces the d.c. voltage components on the power transistor input electrodes $U_{ON}P$ and $U_{ON}M$, so that the "static" operating points—during the operation according to the invention—change.

It is impossible in practical terms for the power transistors TR2 and TR3 to be destroyed if the frequency increases. For the current I0 is controlled by the analog computer and thus cannot exceed a set value. In other words, the transistors TR2 and TR3 are opened simultaneously at any time and at any point on the operating straight line/ellipse, wherein the degree of the opening is controlled by the analog computer. While therefore one transistor is conducting not only the charging current, but in addition also the idling current I0, only the idling current I0 is flowing through the other, complementary power transistor and vice versa. Neither transistor ever gets into the non-conducting state. A genuine class A amplifier mode is therefore achieved.

The power transistors could have various properties. The production tolerances have no influence on the amplifier quality and output. A selection or pairing of the power transistors is not necessary. The high common mode rejection achieved according to the invention makes it possible to reduce the idling current to a very small value.

Figure 4:
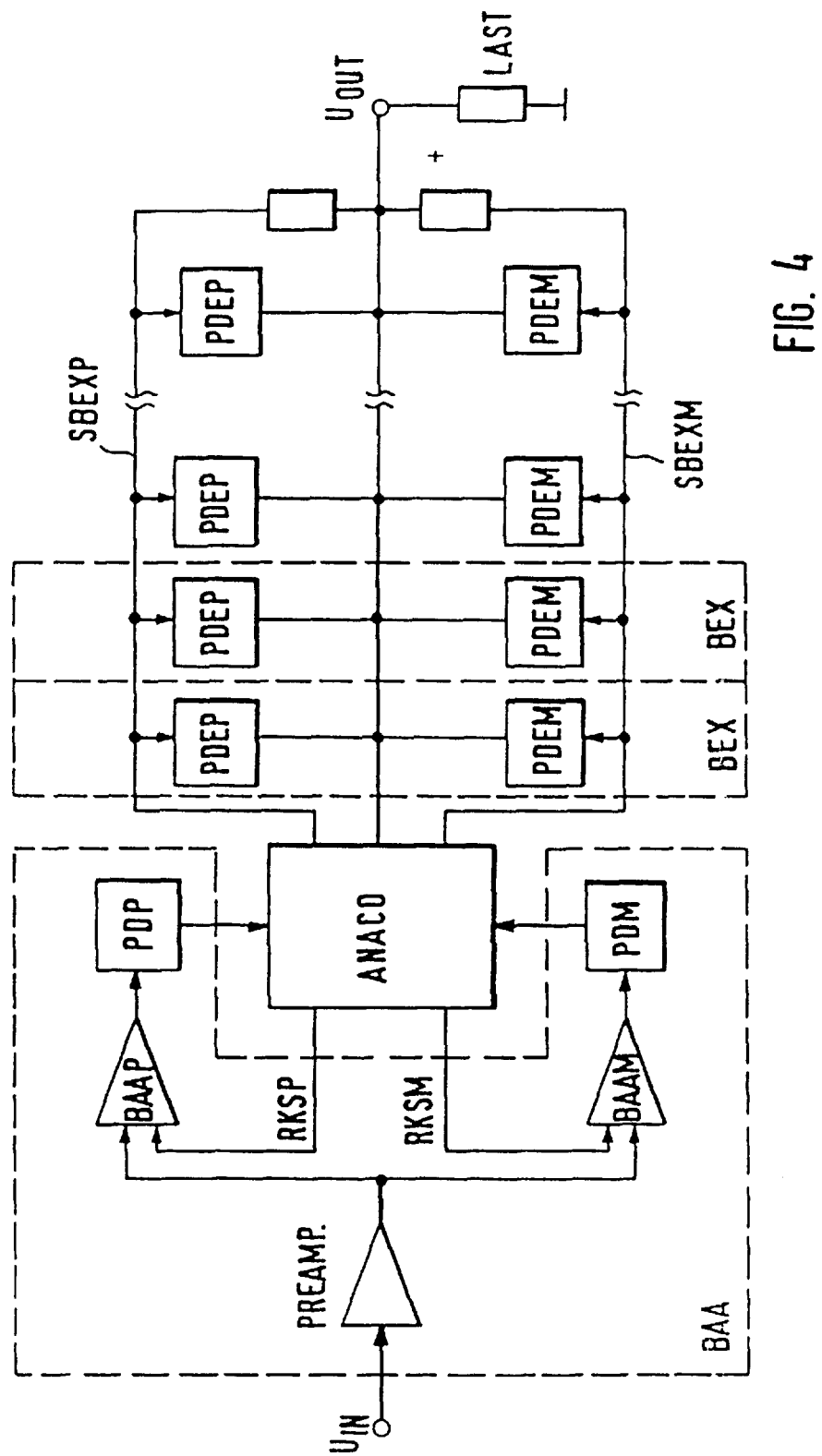
FIG. 4 is a block diagram of the circuit layout of the amplifier system according to the invention.

According to FIG. 4 the amplifier system according to the invention consists of three main parts:

The basic amplifier BAA comprises a pre-amplifier PREAMP and two separate output amplifiers BAAP and BAAM, one for the "plus" side—BAAP, and one for the "minus" side—BAAM. These two output amplifiers BAAP, BAAM, each driven by the input pre-amplifier PREAMP, control separately the respective power transistors PDP, PDM for the "plus" side and for the "minus" side. Each of the output amplifiers BAAP, BAAM has its own feedback. They can for example take the form of differential, in particular operational amplifiers.

In amplifier circuits known to date an increase in the output is ensured by the parallel connection of several transistors in the output stage. The output, and hence the number of transistors to be connected in parallel, nevertheless has to be specified from the outset. For the control of several bipolar power transistors connected in parallel, one or more control transistors have to be fitted in addition. In the case of MOSFET power transistors with parallel connection, the whole of the input capacity is a product of the input capacitance of a transistor and the number of transistors connected in parallel. This makes the control at high frequency difficult, apart from stability problems. The problem consists in the fact that they are fitted in the direct amplification chain. Additional phase shifts therefore arise, which lead to the need for stronger compensation of the amplifier. Any flexibility is forfeited, therefore, and any expansion/modification can lead to stability problems.

According to the invention the idea consists in having a basic amplifier BAA which is stable without qualification (there is also qualified stability). It is moreover possible, according to FIG. 4, to connect in parallel a sufficient number of power transistors PDEP, PDEM as are required for the necessary output. This is possible because the additional power transistors PDEP, PDEM are according to the invention current-controlled individually. Any expansion of the output can therefore be achieved in the case of the amplifier system according to the invention by additional, current-controlled output stages. The control of these additional power stages therefore appears as a small charge for the basic amplifier BAA, so that its stability basic not put at risk. Thus a particular layout of the basic amplifier is possible for any desired output, without the whole amplifier system having to be completely switched over. Each expansion stage naturally has to be stable without qualification, particularly if amplification factor one is worked with.

Figure 5:
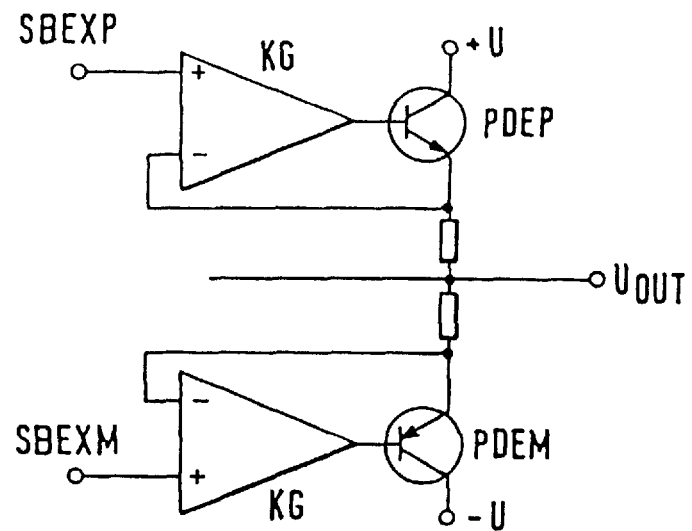
FIG. 5 is the circuit layout of an analog bus expansion stage.

According to FIG. 4 each bus expansion stage BEX consists of two current-controlled power transistors, one for the "minus" side and one for the "plus" side. It is possible to connect this number of bus expansion stages BEX to the output lead $U_{OUT}$ brought out of the analog computer because the control takes place by current by means of an adapted analog bus SBEXP, SBEXM. The basic cell of the expansion stage is shown in greater detail in FIG. 5. According to this the bus expansion stages BEX are provided with the function of a voltage-current converter. The voltage/current ratio can be modified. This means that a bus expansion stage BEX can operate with a different current than the basic amplifier BAA. It is naturally also possible, in the case of a large number of individual bus expansion stages BEX, for these to be operated with different currents. In other words, the current values, which are processed by each individual bus expansion stage, can differ according to the power transistor PDEP, PDEM used. All this enhances the flexibility of the amplifier system and enables a defective power transistor to be replaced by another one without many fitting/removal and compatibility problems.

The analog bus consists of two signal lines which are each brought out of the analog computer ANACO and operate according to the following equations:

$$SBEXP=STRP+I0$$

$$SBEXM=STRM+I0,$$

where STRP is the current from the power transistor PDP of the basic amplifier BAA (plus side) and STRM the current from the power transistor PDM of the basic amplifier BAA (minus side)

By adaptation of the analog bus is understood the equation between the output impedance of a signal generator in the analog computer ANACO, the characteristic impedance of the lines and a resistor fitted at the end of the lines. It should be noted that the adaptation is not absolutely necessary. It should also be noted that in the case of the bus expansion BEX a simple parallel connection of the power transistors is not involved; instead each power transistor can be controlled individually and independently according to the invention. One pair of complementary power transistors PDEP, PDEM forms—optionally with in-line voltage-current converters as coupling members—one expansion component which can be retrofitted as required.

Figure 6:
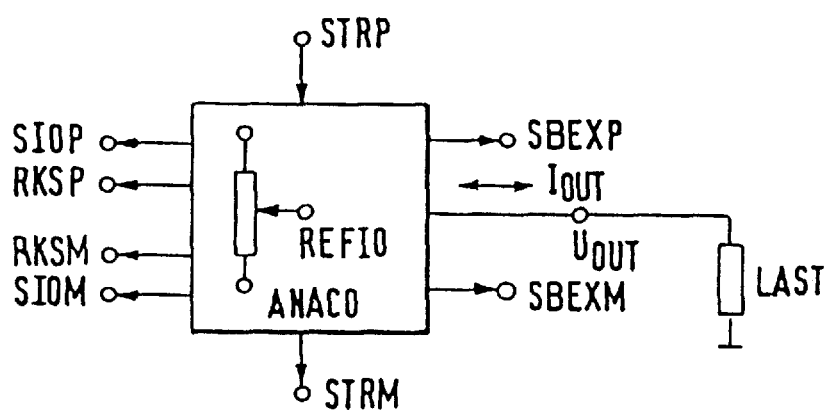
FIG. 6 is an interface block diagram of the analog computer used according to the invention.

According to FIGS. 4 and 6 the analog computer ANACO generates the feedback signals RKSP, RKSM for the individual output amplifier branches BAAP, BAAM of the basic amplifier BAA and the control signals SBXP, SBXM for the power expansion transistors PDEP, PDEM of the bus expansion stages BEXP and BEXM. The analog computer ANACO passes to the basic amplifier part BAA a feedback signal which can consist for example of the output voltage $U_{OUT}$ and a fault voltage for the idling current I0. In addition the analog computer ANACO calculates the power loss of the power transistors and in the event of an exceeding of maximum limit values protects the power output stage against overloading. The list of the interface signals of the analog computer ANACO with the small signal or basic amplifier part BAA is as follows:

STRP-current from the power transistor of the basic amplifier BAA, plus side;

STRM-current from the power transistor of the basic amplifier BAA, minus side;

SIOP-control signal for idling current I0, plus side;

SIOM-control signal for idling current I0, minus side;

RKSP-feedback signal, plus side; and

RKSM-feedback signal, minus side.

The interface signals with the bus expansion stages BEX are as follows:

SBEXP-control signal for BUS expansion, plus side;

SBEXM-control signal for BUS expansion, minus side.

Other important signals:

REFI0-reference for I0 idling current;

IOUT-output current;

UOUT-output voltage;

I0-idling current through the power transistors.

Using these abbreviations, the following equations can be written for the operation of the power amplifier system according to the invention:

$$I0=[STRP-(-STRM)]\text{-absolute value (IOUT)};$$

$$SIOP=SIOM=K\times(REFI0-I0),$$

Several kinds of feedbacks come within the scope of the invention:

RKSP=UOUT+K×STRP

RKSM=UOUT+K×STRM.

The idling current control signals SIOP and SIOM are in such cases mixed at another point of the amplification chain of the basic or small-signal amplifier BAA with the useful signal.

If the signal mixing is already taking place in the analog computer, then:

RKSP=UOUT+SIOP

RKSM=UOUT+SIOM.

On the other hand mixing can also mean within the scope of the invention that the input signal to be amplified is added algebraically into the "basic amplifiers plus/minus" (BAAM, BAAP) with the output signal of the analog computer ANACO.

The analog bus expansion signals are operated as follows:

SBEXP=A1×(STRP+I0)

SBEXM=A2×(STRP+I0)

where A1, A2 are constants.

The technical realization of all these equations by means of logic circuits inside the analog computer is familiar to the skilled man.

The list of further abbreviations and reference symbols used:

BAA-basic or small-signal amplifier module;
BAAP-basic amplifier branch for positive voltage;
BAAM-basic amplifier branch for negative voltage;
PDP-power transistor of the BAAP;
PDM-power transistor of the BAAM;
BEX-power expansion assembly;
BEXP-power expansion branch for positive voltage;
BEXM-power expansion branch for negative voltage;
PDEP-power expansion transistor of the BEXP;
PDEM-power expansion transistor of the BEXM;
SIOP-control signal for I0 plus side
SIOM-control signal for I0 minus side
STRP-current transistor plus side
STRM-current transistor minus side
SBEXP-control signal for BUS expansion, plus side;
SBEXM-control signal for BUS expansion, minus side;
I0-idling current through the power transistors;
ANACO-analog computer;
REFI0-reference value for I0.

Practical tests with amplifiers realized according to the invention have produced the following interface results:

1. Basic amplifier BAA without bus expansion BEX for a total amplification of 70 (37) dB (pre-amplifier with A=20 dB included):
   Output voltage: ±60 volt
   Idling current (from the power transistor): <10 milliamperes
   Continuous output at 1 kHz and 120 watt (rms value) at 15 ohm
   Bandwidth with full output (−3 dB): DC−1.2 MHz
   Bandwidth (amplification 1): >7 MHz
   Rise time: >700 volt/microsec.
2. Basic amplifier BAA with two bus expansion stages total amplification=70 (37 dB) (pre-amplifier with A=20 included):
   Output voltage: ±80 volt
   Idling current (power transistor): <10 milliamperes
   Continuous output at 1 kHz and 800 watt (rms value) at 4 ohm
   Bandwidth with full output (−3 dB): DC−1 MHz
   Bandwidth (amplification 1): 7 MHz
   Rise time; >700 volt/microsec.

"Fault voltage for the idling current" is an output voltage of the analog computer ANACO and represents an amplification of the difference between the actual, momentary idling current I0 and the predetermined reference idling current REFI0. Due to the internal, large amplification this input fault voltage of the analog computer is infinitesimally small, but cannot be disregarded. This fault voltage amplified by the analog computer is added to the input signal and controls together with the latter the output stage. This result of this is that the amplified signal (e.g. ten-fold) is found at the output, but the output stages of the plus and minus side must simultaneously allow the idling current through.

In addition to the regulation of the idling current the analog computer can within the scope of the invention also protect the power transistors. All power semiconductors or tubes in existence today have their own maximum power dissipation. The latter is converted into heat. If this heat cannot be dissipated, the power transistor/the tube is destroyed after a certain time. The data from component catalogues also prescribe a maximum current and a maximum voltage which must not be exceeded. Otherwise the power transistors/tubes would be destroyed. The analog computer calculates the momentary power dissipation at each transistor/each tube and holds the momentary power dissipation, depending on safety requirements, just below the maximum value, in order to guarantee the heat dissipation, or permits for a short time a higher current which drives the power dissipation above the maximum value for a few seconds. The analog computer compares the voltage applied momentarily to the transistor/to the tube and the current with the permissible maximum values, and it the safety values are exceeded, takes suitable measures.

Due to the increase in the input signal frequency the idling current grows by virtue of natural, physical phenomena. The analog computer senses this increase, by comparing the momentary idling current with its set value, and inhibits the power transistors/tubes accordingly. This is actually equivalent to the modification of the static operating point, dependent on the frequency.

Figure 7:
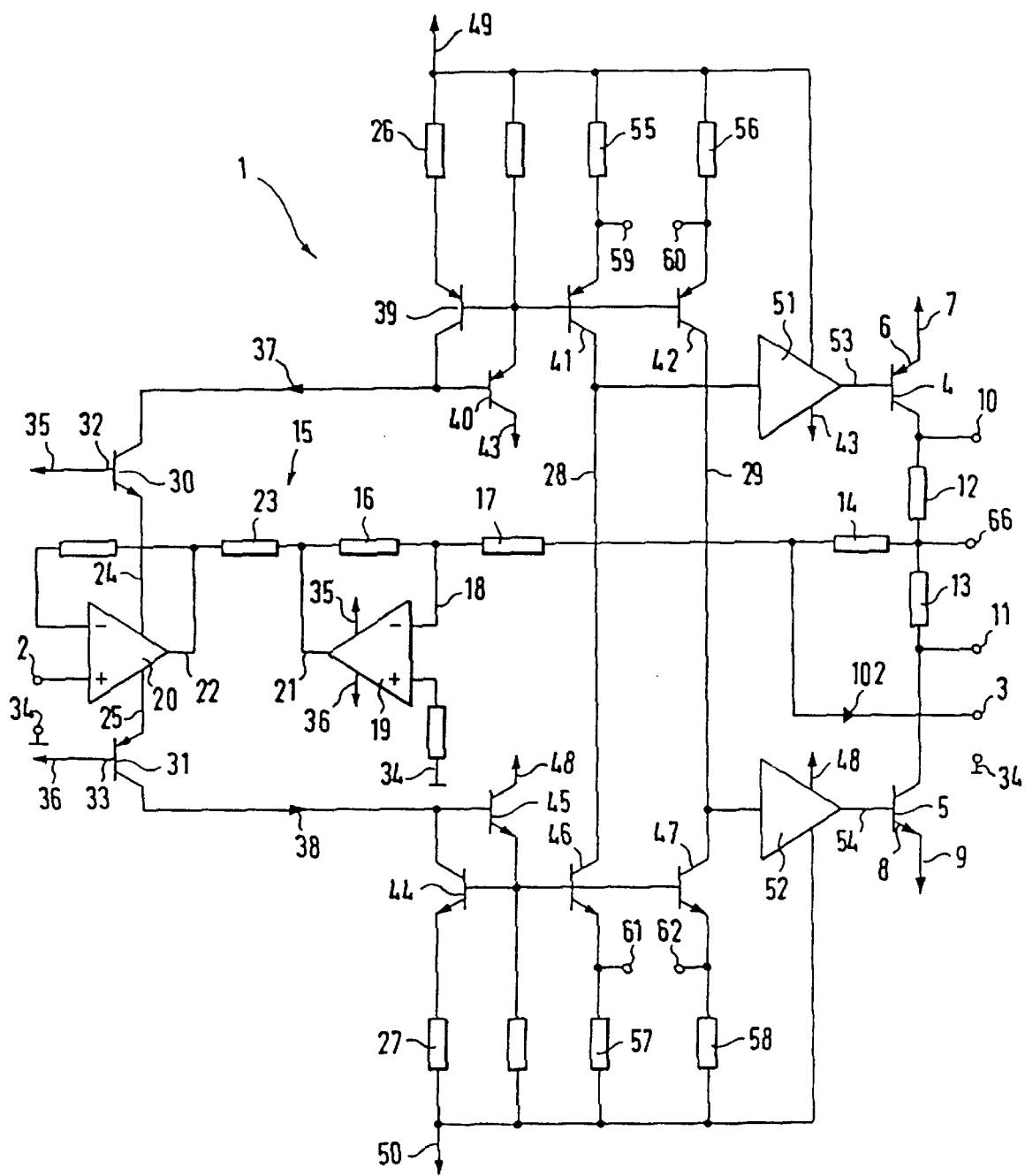
FIG. 7 is a power amplifier with two power amplifier elements, activation stages assigned to the latter and a superimposed control of the output voltage, with which connection possibilities for the input and output signals of an idling current controller are provided.

FIG. 7 contains a circuit diagram of a power amplifier 1, reduced to the principal elements. The input terminal is labelled 2, the output terminal 3. The output stage is formed from two mutually complementary power transistors 4, 5. The one power transistor 4 is a pnp type whose emitter terminal 6 is connected to the positive supply voltage 7. The other power transistor 5, opposite the latter, is a npn type, whose emitter terminal 6 is connected to the negative supply voltage 9. The collector terminals 10, 11 of these two transistors 4, 5 are connected to one another via two low-valued precision resistors 12, 13. Between the common node 66 of these two precision resistors 12, 13 and the output terminal 3 of the power amplifier 1 a further low-valued precision resistor 14 is connected.

The voltage at the output terminal 3 of the power amplifier 1 is compared by a superior voltage regulator 15 with the input signal at the terminal 2 and stabilized in such a way that a proportionality between input and output signals 2, 3 is guaranteed. To this end the output signal 3 is subdivided by an operational amplifier 19 wired as an inverter in the ratio of the resistors 16, 17, which corresponds to the inverse ratio of the desired amplification, and is made available as low resistance. The same procedure is adopted for the input signal 2, which is produced with unchanged voltage, but increased output current, by the operational amplifier 20 wired as a voltage follower. The two outputs 21, 22 are connected to one another by a relatively high-valued resistor 23, which converts the voltage difference concerned into a current signal proportional thereto. This current is, depending on polarity, approximately equal to the current input of the operational amplifier 20 at its positive operating voltage terminal 24 or at the negative operating voltage terminal 25. These currents flow through the input resistors 26, 27 of the activation stages 28, 29 and generate there, referred to the respective operating voltage 7, 9, a voltage drop proportional to the voltage difference at the resistor 23.

In order to protect the operating voltage inputs 24, 25 of the operational amplifier 20 against excess voltages, a transistor 30, 31 is connected between the operating voltage terminals 24, 25 and the input resistors 26, 27 respectively of the activation stages 28, 29. The base terminals 32, 33 of these transistors 30, 31 lie on positive and negative supply voltages 35, 36 which are held constant compared with the circuit earth 34 and have values not dangerous for the operational amplifier 20. These supply voltages 35, 36 are transmitted across the transistors 30, 31 wired as emitter followers onto the operating voltage inputs 24, 25 of the operational amplifier 20.

The currents 37, 38 on which the operational amplifier 20 draws at its operating voltage inputs 24, 25 in order to be able to supply a suitable output current at its output 22, flow mainly through the input resistors 26, 27 of the activation stages 28, 29. The transistors 39 and 40 each form together with the transistors 41 and 42 a current level which ensures that the emitter currents of the transistors 41 and 42 are approximately proportional to the current 37. To this end the collector of the transistor 40 is placed on a fixed supply voltage 43 which is a few volts lower than the positive supply voltage 7. A similar role is played by the transistors 44 and 45, which likewise each form a current level together with the transistors 46 and 47 and ensure that the emitter currents of the transistors 46 and 47 are approximately proportional to the current 38. The collector of the transistor 45 is connected to a constant supply voltage 48 which is a few volts higher than the negative supply voltage 9.

Two sets of transistors 41 and 46 and 42 and 47 are each connected in series to form an activation stage 28 and 29 respectively. Since the current through the resistor 23 can flow in only one direction at a time, the operational amplifier 20 receives a significant current 37, 38 only at one of its two operating voltage inputs 24, 25, so that the transistors 41, 46 and 42, 47 are activated in push-pull. On the other hand, however, the current at the second operating voltage input 25, 24 of the operational amplifier 20 is by virtue of the internal current consumption never zero, so that because of the current levels 39, 40, 41, 62 and 44, 45, 46, 47 none of the output transistors 41, 42, 46, 47 of the two activation stages 28, 29 is ever completely disabled. For this reason a constant idling current can flow through the output transistors 41, 46 and 42, 47 of the activation stages 28, 29, so that the potentials 28, 29 can occupy almost the whole range between the supply voltages 49 and 50. The output signals of the activation stages 28, 29 are provided in a low resistance state by a respective driver unit 51, 52 at the base 53, 54 of each of the two power transistors 4, 5.

An emitter resistor 55, 56, 57, 58 is connected into the emitter circuit of the output transistors 41, 42, 46, 47 of the two activation stages 28, 29 respectively. By the parallel connection of further transistors it is possible for additional currents to be fed at the emitter terminals 59, 60, 61 and 62 of the output transistors 41, 42, 46, 47 of the activation stages 28, 29, which flow through the relevant emitter resistors 55, 56, 57, 58, thereby influence the feedback of the relevant current level and hence cause a modification of the output signal of the relevant activation stages 28, 29.

Figure 8:
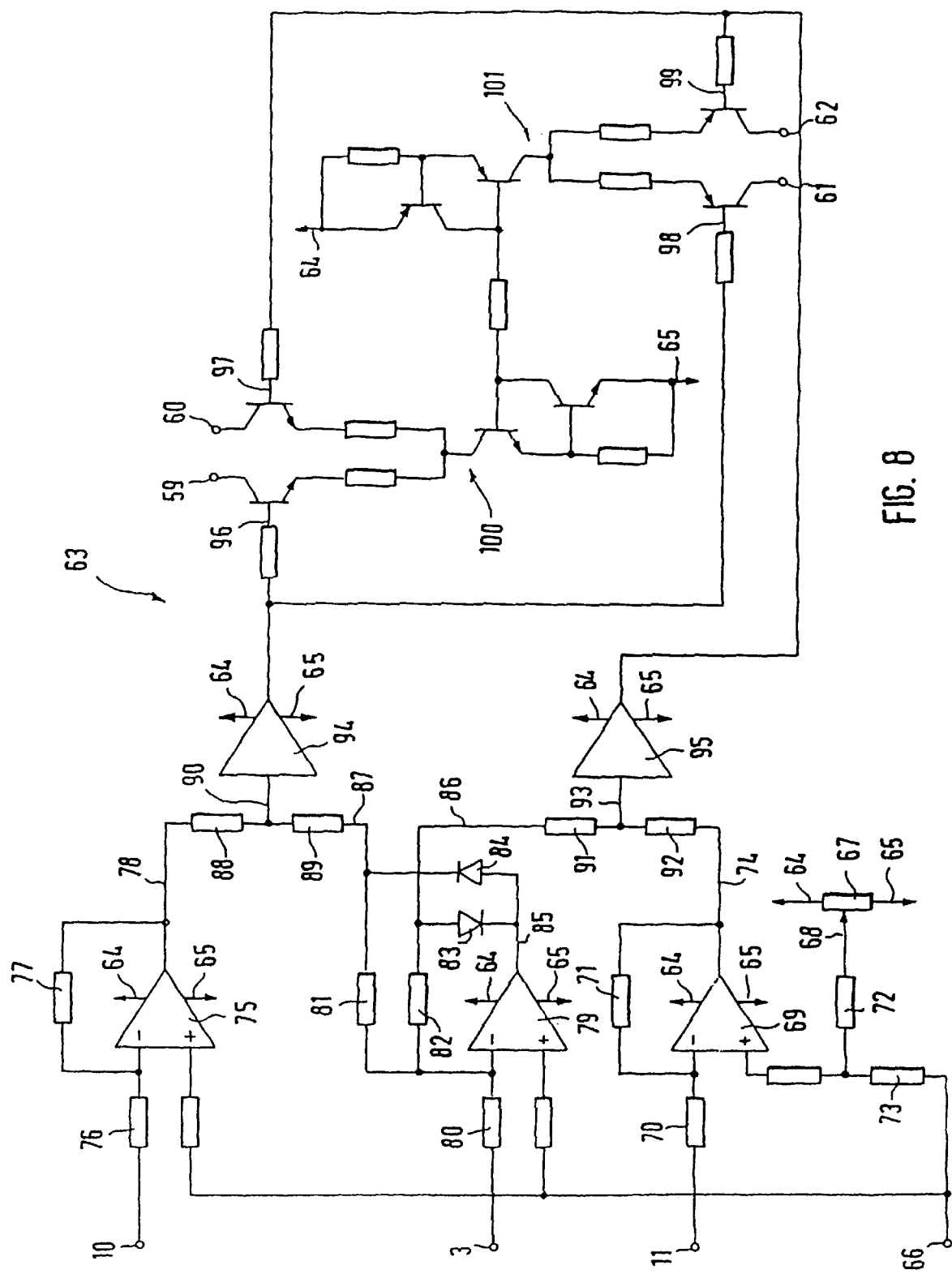
FIG. 8 is an idling current controller according to the invention, which can be connected to the respective signal terminals of the power amplifier from FIG. 7.

The idling current through the power transistors 4, 5 of the power amplifier 1 is stabilized to a constant value by the idling current controller 63 reproduced in FIG. 8. The input signals of the idling current controller 63 are the potential of the star point 66 of the precision resistors 12, 13, 14 together with the signals at their free ends 3, 10, 11. The potential of the star point 66 forms simultaneously the reference potential for the idling current controller 63. Since it obeys approximately the output signal 3, which executes a voltage swing between the two supply voltages 7, 9, it is necessary to provide the idling current controller 63 with its own power supply obeying this potential fluctuation. The latter consists of a positive operating voltage 64 constant relative to the reference potential and a negative supply voltage 65 likewise constant relative to the fluctuating reference potential 66.

For the sake of simplicity of expression, the signals of the idling current controller 63 are referred to the potential 66 below, without this explicitly being mentioned. A negative voltage is therefore said to be negative compared with the reference potential 14, although it can in reality be positive, referred to the earth potential 34 of the power amplifier.

Figure 9:
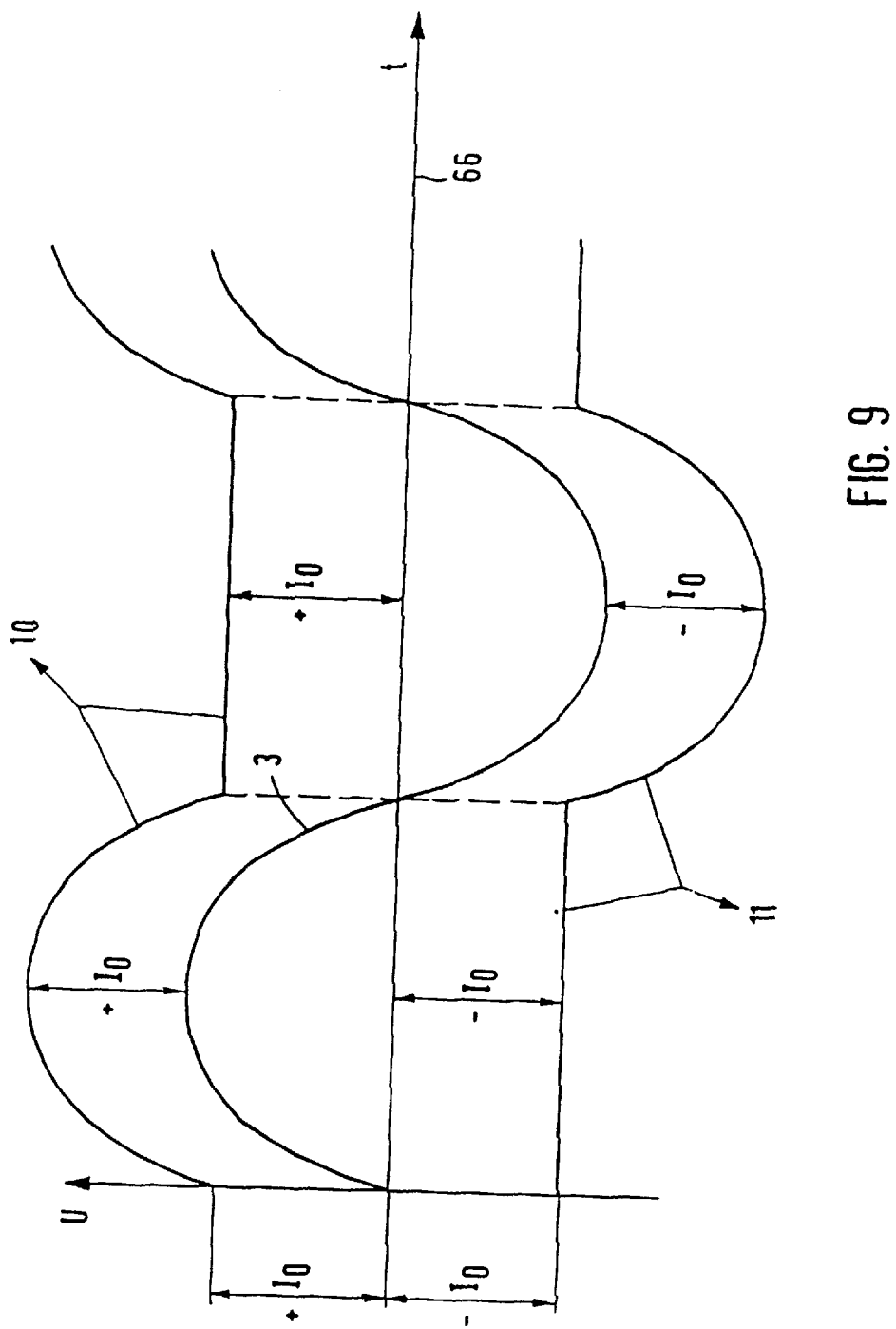
FIG. 9 is a time chart with an exemplifying plot of the input signals of the idling current controller from FIG. 8.

Exemplifying plots of the voltages 3, 10 and 11 are shown in FIG. 9. From these input voltages the idling current controller forms output currents at the terminals 59, 60, 61, 62, which are coupled to the relevant points of the power amplifier 1 and permit an effective and precise control of the idling current, without influencing the superior voltage regulator IS.

The idling current set value is predetermined on the potentiometer 67. The input voltage 11 is subtracted from this voltage potential set on the tap 68 of the potentiometer 67 by means of the operational amplifier 69 wired as a subtracter. To this end resistors 70, 71, 72, 73 of equal size are selected. A voltage is thus obtained at the output 74 of the operational amplifier 69 which is equal to the difference of the voltage 68 minus the voltage 11.

The operational amplifier 75 is wired as a simple inverter, the resistors 76 and 77 are of equal size, so that the output signal 78 of the operational amplifier 75 is equal to the inverted input voltage 10.

The operational amplifier 79 is also in principle wired as an inverter, in which the resistors 80, 81, 82 are identical. However, as a result of two additional, anti-parallel diodes 83 and 84, the feedback through the two resistors 81, 82 varies as a function of the polarity of the input voltage 3 of the idling current controller 63. With positive input voltage 3 a current flows through the resistors 80, 82 and the diode 83 to the output 85 of the operational amplifier 79, while with negative input voltage 3 a current flows from the output 85 of the operational amplifier 79 via the diode 84 and the resistors 81, 80 to the input terminal 3. The result of this is that with positive input voltage 3 the inverted input voltage 3 can be tapped off at the node 86, while at the same time approximately zero voltage is obtained at the node 87. Conversely with negative input voltage 3 the potential at the node 87 is equal to this inverted input voltage 3, while approximately zero potential exists at the node 86.

The mean value 90 between the two potentials 78 and 87 is formed by means of the identically dimensioned resistors 88 and 89. Similarly the identical resistors 91 and 92 serve to form the mean value 93 between the voltage potentials 74 and 86. The signals 90 and 93 are passed by means of driver units 94, 95 to the mutually complementary inputs 96, 97 and 98, 99 of two differential amplifiers 100, 101.

The operational amplifiers 69, 75 and 79 are so wired that the difference between the voltage potentials 90 and 93 is equal to the difference of idling current set value and actual value at any point in time. For example, during the positive half wave of the controller input voltage 3 the output current 102 of the power amplifier 1 is passed from the upper power transistor 4, which is additionally traversed by the idling current. At this moment the diode 83 becomes live and the inverted controller input signal 3 is added via the node 86 to the signal 93, which is applied to the inputs 97 and 99 of the differential amplifiers 100, 101. The component of the input signal 10, which corresponds to the output current 102, is likewise inverted in the operational amplifier 75 and added to the signal 90, which is applied to the other inputs 96, 98 respectively of the differential amplifiers 100, 101. These two voltage components lead to a unidirectional adjustment of the input signals 96, 97, 98, 99 of the differential amplifiers 100, 101, which have no effect on the output currents of the latter at the terminals 59, 60, 61, 62.

The remaining components of the input voltages 10 and 11, which correspond to the constant idling currents, are likewise both inverted and likewise added to the voltages 90, 93 applied to different inputs 96, 97 and 98, 99 of the differential amplifiers 100, 101. Since the input voltages 10, 11, by virtue of the delta connection of the precision resistors 12, 13 and 14, have opposite polarity, the signals 90, 93 are however adjusted the opposite way, so that a control in opposite direction likewise arises at the differential amplifier outputs 59 and 60 and 61 and 62.

Since, finally, the idling current set value 67 has been included subtractively in the operational amplifier 69, it follows that the difference of the input signals 96 and 97 and 98 and 99 of the differential amplifiers 100 and 101 is proportional to the deviation of the idling current actual value from the idling current set value. This standard difference is amplified by the differential amplifiers 100 and 101 and coupled as current difference at the emitter terminals 59, 60 and 61, 62 of the output transistors 41, 42, 46, 47 of the activation stages 28, 29. In the emitter resistors 55, 56 and 57, 58 an addition of this current difference to the emitter currents of the transistors 41, 42, 46, 47 takes place, which are approximately equal to the output currents 37, 38 of the voltage regulator 15. Since in the case of a deviation from the predetermined idling current set value the coupled currents are adjusted in opposite direction at the terminals 59 and 60 and 61 and 62, a level shift takes place between the output signals 28, 29 of the activation stages, whereby in particular the power transistor 4 or 5 not traversed by the output current 102 is further opened or disabled, so that the idling current passing through the two power transistors 4, 5 remains equal to the set value set on the potentiometer 67 and hence constant.

I claim:

1. An improved power amplifier having an input and a plurality of power amplifier circuit elements connected in push-pull arrangement in at least one complementary pair connected to a central node and having a bias voltage source coupled to the elements for generating a transverse idling current flowing through the complementary pair, wherein the improvement comprises:

(a) a regulating, feedback controller circuit for controlling and maintaining the idling current constant, the controller circuit having (i) a set point input;
    (ii) inputs connected to current sensing circuit elements in the amplifier circuit;
    (iii) analog, arithmetic computing circuits connected to said inputs for continuously computing the instantaneous difference between a detected transverse idling current and a set value of idling current at the set point input; and
    (iv) idling current control signal outputs connected to the bias voltage source, whereby said controller circuit varies said bias voltage in proportion to the instantaneous difference between the detected transverse idling current and the set value of idling current to maintain a constant transverse idling current;

(b) bipolar complementary transistors forming said power amplifier circuit elements and having collectors connected to said central node, one of said inputs to the controller being connected to the central node;

(c) at least one expansion stage complementary pair of transistors connected in a push-pull arrangement in parallel with the previously recited transistors, the additional transistors also connected to the controller circuit for controlling their bias voltage and maintaining their idling current constant; and (d) an impedance converter circuit comprising a voltage to current converter circuit interposed between the controller circuit and the expansion stage wherein the circuit has feedback of current through the expansion stage transistors.

2. An amplifier in accordance with claim 1 wherein there are a plurality of said parallel expansion stages all connected to the controller circuit through an analog bus.

3. An amplifier in accordance with claim 2 wherein the analog bus includes two signal output leads from the controller circuit, one lead connected to control power amplifier transistors having a positive operating voltage and the other connected to control power amplifier transistors having a negative operating voltage.

4. An amplifier in accordance with claim 2 wherein the controller circuit outputs include a plurality of mutually complementary control outputs connected to the complementary transistors.

5. An amplifier in accordance with claim 2 wherein the controller circuit further comprises a reference source and a comparator having one input connected to the reference source and the other input connected to the idling current.

6. An amplifier in accordance with claim 5 wherein the analog computing circuits include a summing circuit for summing the idling current of the power amplifier elements and a reference current and a multiplying circuit for multiplying the sum by a constant.

7. A power amplifier according to claim 6, characterized in that an idling current control signal is fed to a mixing stage connected to receive an amplifier useful signal.

8. A power amplifier according to claim 6, the controller circuit is an analog computer which, for the generation of feedback signals comprises a multiplying circuit coupled to current mirror.

9. A power amplifier according to claim 1 wherein the current sensing elements are star-connected.

10. A power amplifier according to claim 9, wherein the current sensing elements are ohmic resistors.

11. A power amplifier according to claim 10 wherein terminals of the resistors are connected between outputs of the power amplifier circuit elements and an output of the power amplifier.

12. An amplifier in accordance with claim 1 wherein the current sensing elements comprise three current sensing resistors each having a first terminal star connected to a common star node, one resistor connected to a first of said power amplifier elements for sensing the first element current, another resistor connected to a second power amplifier element which is in push-pull connection to said first element for sensing the current in the second element and the third resistor connected to the central node in series with an output of the amplifier to sense the amplifier output current.

13. An amplifier in accordance with claim 12, wherein the set point input is a reference potential and is equal to the potential of said star node.

14. An amplifier in accordance with claim 13 wherein said controller has supply voltages which are constant compared with the potential of said star node.

15. An amplifier in accordance with claim 13 wherein the controller circuit includes an analog arithmetic circuit having inputs connected to said three resistors for computing a signal proportional to the transverse idling current from the currents through the transistors and the output current.

16. An amplifier in accordance with claim 15 wherein the controller circuit further includes a subtraction circuit for forming a signal representing the difference between the signal proportional to the transverse idling current and said set point value.

17. An amplifier in accordance with claim 16 and further comprising a multiplier circuit for multiplying said difference signal by a multiplier factor.

18. An amplifier in accordance with claim 17 further comprising separate activation stages preceding said power amplifier circuit elements.

19. An amplifier in accordance with claim 18 wherein the activation stages comprise an emitter resistor and the amplifier input and the controller circuit outputs are superimposed by current feedback through the emitter resistor which conducts a current including a control current proportional to the output of the controller circuit.

20. An amplifier in accordance with claim 19 wherein said difference signal is applied to a differential amplifier having a collector resistor which is said emitter resistor.

21. An amplifier in accordance with claim 20 wherein each of said activation stages is formed from two complementary transistors connected and operated in push-pull arrangement, each complementary transistor including an emitter resistor, the emitter resistors also connected as collector resistors of two differential amplifiers arranged symmetrically with respect to a reference potential connected as said set point input.

* * * * *